(12) United States Patent
Mouchet et al.

(10) Patent No.: US 10,914,763 B2
(45) Date of Patent: Feb. 9, 2021

(54) ELECTRICAL CURRENT TRANSDUCER

(71) Applicant: LEM INTELLECTUAL PROPERTY SA, Fribourg (CH)

(72) Inventors: Steve Mouchet, Pringy (FR); Félix Buhlmann, Lausanne (CH); Stephan Trombert, Leschaux (FR); Steve Moureaux, Bonne (FR)

(73) Assignee: LEM International SA, Plan-les-Ouates (CH)

( * ) Notice: Subject to any disclaimer, the term of this patent is extended or adjusted under 35 U.S.C. 154(b) by 31 days.

(21) Appl. No.: 16/342,291

(22) PCT Filed: Oct. 13, 2017

(86) PCT No.: PCT/EP2017/076195
§ 371 (c)(1),
(2) Date: Apr. 16, 2019

(87) PCT Pub. No.: WO2018/073121
PCT Pub. Date: Apr. 26, 2018

(65) Prior Publication Data
US 2020/0057096 A1 Feb. 20, 2020

(30) Foreign Application Priority Data
Oct. 18, 2016 (EP) .................................... 16194452

(51) Int. Cl.
*G01R 15/18* (2006.01)
*G01R 19/00* (2006.01)
(52) U.S. Cl.
CPC ....... *G01R 15/183* (2013.01); *G01R 19/0092* (2013.01)

(58) Field of Classification Search
None
See application file for complete search history.

(56) References Cited

U.S. PATENT DOCUMENTS

| 4,487,812 A | 12/1984 | Kawasaki |
| 6,580,348 B1 | 6/2003 | Hundt |
| 2008/0094162 A1* | 4/2008 | Schaerrer ............. G01R 15/185 336/178 |

FOREIGN PATENT DOCUMENTS

| EP | 1617228 | 1/2006 |
| EP | 2515125 | 10/2012 |

OTHER PUBLICATIONS

International Search Report and Written Opinion issued by the European Patent Office, dated Feb. 5, 2018, for International Patent Application No. PCT/EP2017/076195; 12 pages.

* cited by examiner

*Primary Examiner* — Jas A Sanghera
(74) *Attorney, Agent, or Firm* — Faegre Drinker Biddle & Reath LLP

(57) ABSTRACT

A current transducer including a housing comprising an outer casing, a magnetic circuit core configured to encircle at least one primary conductor, and a magnetic field detector positioned in a magnetic circuit gap of the magnetic circuit core. The housing further includes an inner support part comprising a main body portion and a magnetic core support portion. The magnetic circuit core is in the form of a thin strip of amorphous material supported on the main body portion and magnetic core support portion, the magnetic circuit gap being formed between overlapping ends of the strip.

15 Claims, 8 Drawing Sheets

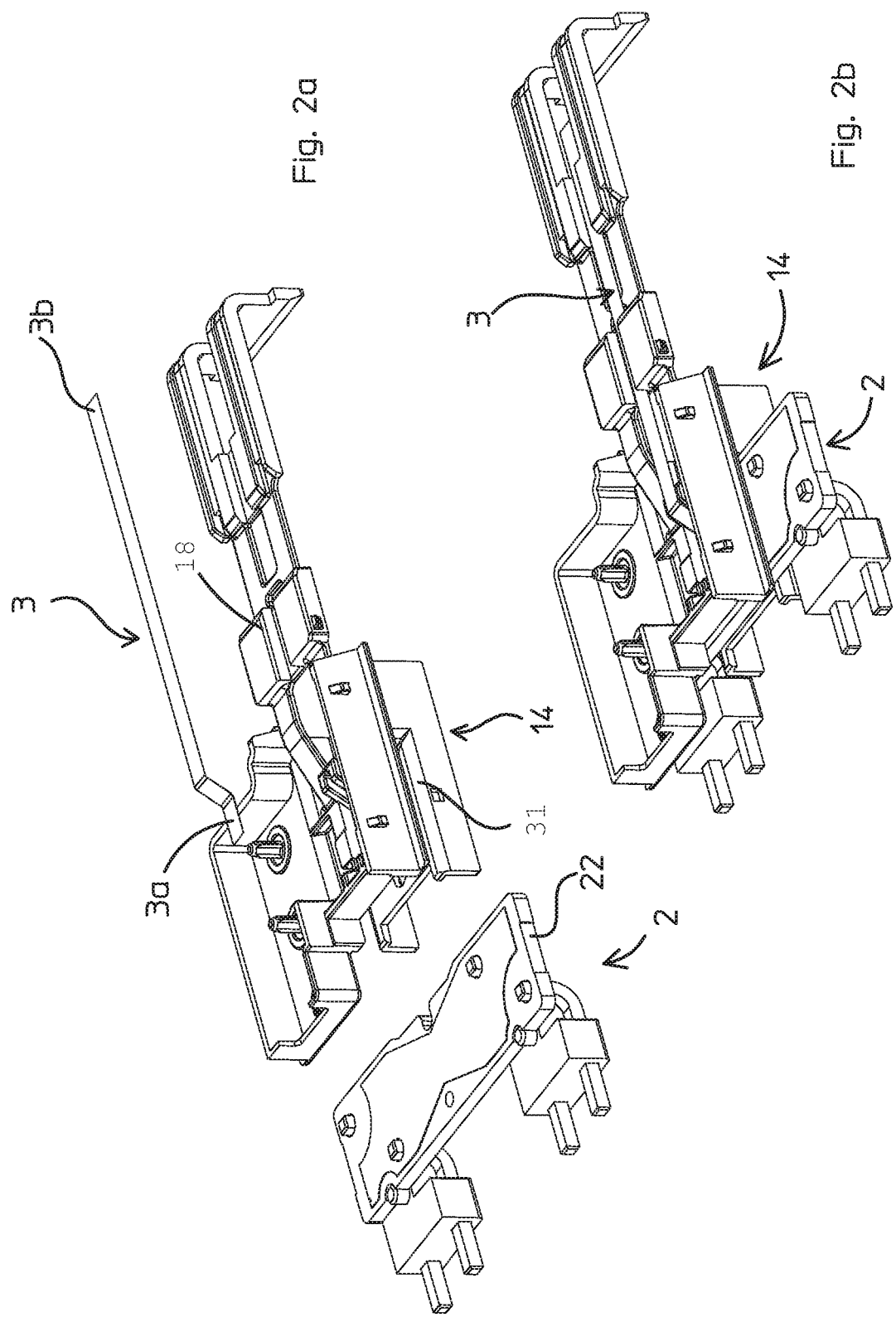

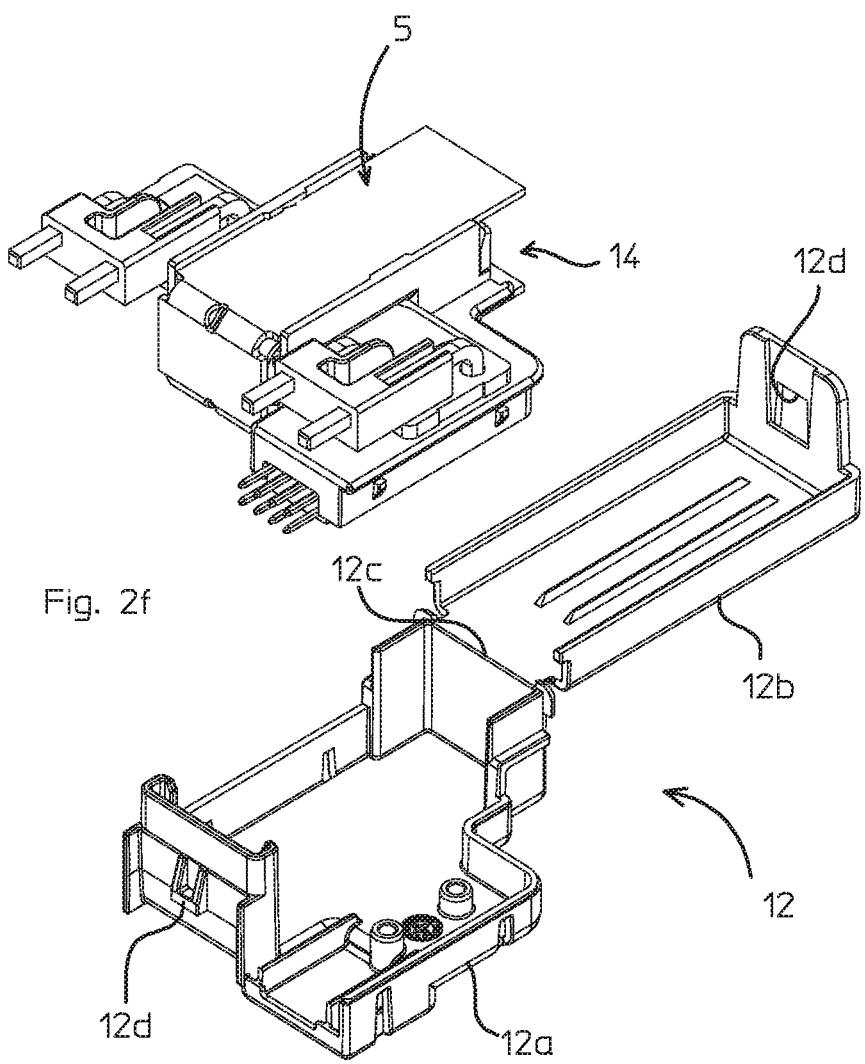

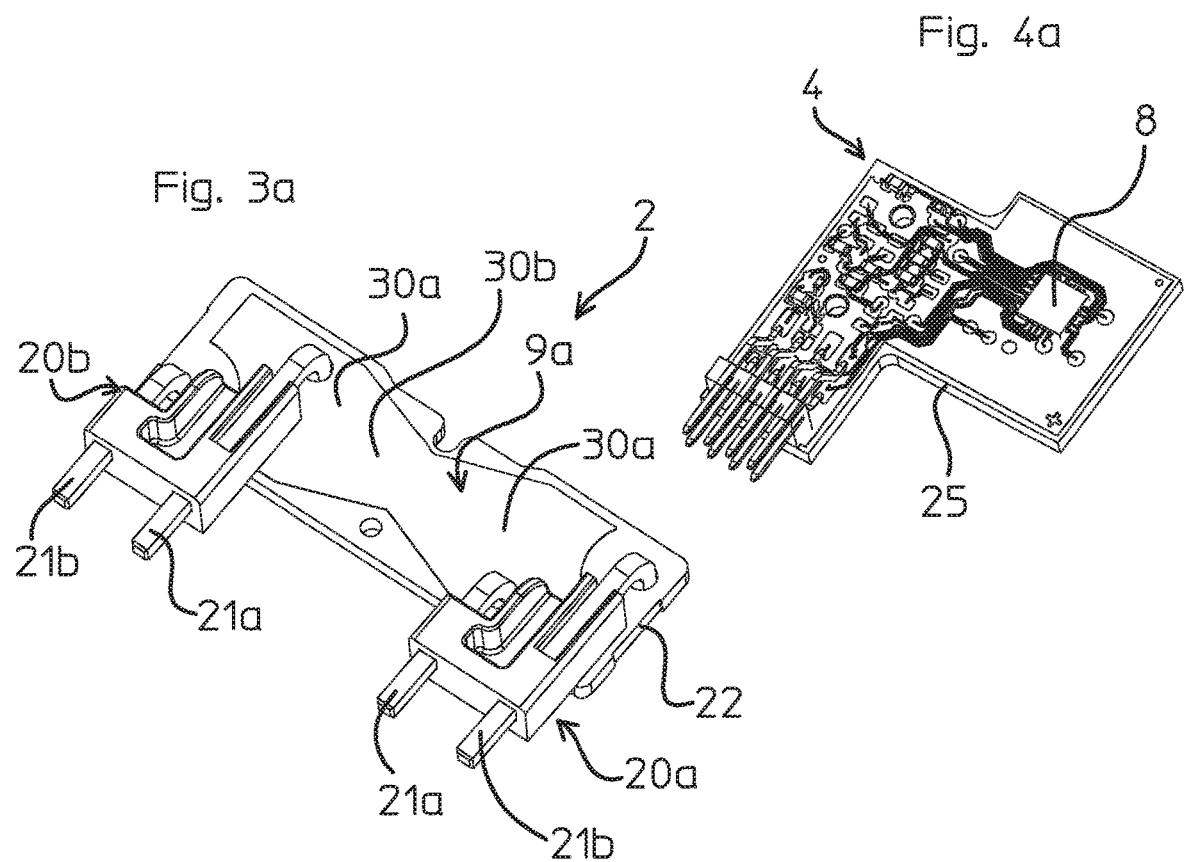

ELECTRICAL CURRENT TRANSDUCER

CROSS-REFERENCE TO RELATED APPLICATIONS

The present application is a national stage entry of International (PCT) Patent Application Number PCT/EP2017/076195, filed Oct. 13, 2017, which in turn claims priority to European Patent Application No. 16194452.5, filed Oct. 18, 2016, the subject matter of which are expressly incorporated herein by reference.

The present invention relates to an electrical current transducer for measuring a differential current, in particular to detect a residual or leak current.

There is a continuous desire to reduce manufacturing costs while increasing the performance and reliability of current transducers, which may include aspects such as measurement accuracy, large measurement operating range, reduced sensitivity to disturbance by external magnetic fields, manufacturing repeatability, stability over time and usage, and robustness. One of the main factors in the manufacturing cost of a current transducer is in the assembly of the components forming the transducer.

It is an object of this invention to provide an electrical current transducer that is accurate, reliable and robust, yet economical to manufacture.

It is advantageous to provide a closed-loop electrical current transducer that is simple to assemble and that has few components.

It is advantageous to provide an electrical current transducer that is robust and stable over time.

It is advantageous to provide an electrical current transducer that is compact.

Various objects of this invention have been achieved by providing the current transducer according to claim 1.

Disclosed herein is a current transducer including a housing comprising an outer casing, a magnetic circuit core configured to encircle at least one primary conductor, and a magnetic field detector positioned in a magnetic circuit gap of the magnetic circuit core. The housing further includes an inner support part comprising a main body portion and a magnetic core support portion. The magnetic circuit core comprises at least one strip of amorphous material with a magnetic reluctance smaller than the reluctance of the magnetic circuit gap and having a thickness less than 0.1 mm supported on the main body portion and magnetic core support portion, the magnetic circuit gap being formed between overlapping ends of the strip.

In an advantageous embodiment, the main body portion and the magnetic core support portion are connected via hinge portions configured to allow the magnetic core support portion to wrap around the main body portion.

In an advantageous embodiment, the hinge portions are flexible webs integrally formed with the main body portion and magnetic core support portion.

In an advantageous embodiment, the transducer includes a primary circuit unit comprising a first circuit board lodged in the main body portion of the inner support part and at least one conductive trace on the circuit board constituting a portion of the at least one primary conductor.

In an advantageous embodiment, the first circuit board comprises a plurality of circuit traces on different layers of the first circuit board, forming said at least one primary conductor.

In an advantageous embodiment, the transducer comprises at least two primary conductors configured to carry currents flowing in opposing directions, wherein the transducer is configured for a differential current measurement.

In an advantageous embodiment, the circuit traces on different layers overlap each other by at least 80%, seen in a direction orthogonal to the circuit board.

In an advantageous embodiment, the one or more conductive traces of the one or more primary conductor portions comprise a mid-portion of narrower width than end portions.

In an advantageous embodiment, the transducer comprises a secondary circuit unit comprising a second circuit board lodged in the main body portion of the inner support part, the magnetic field detector being mounted on the second circuit board.

In an advantageous embodiment, the secondary circuit unit comprises a compensation coil in the form of windings of a circuit trace on one or more layers of the second circuit board around the magnetic field detector.

In an advantageous embodiment, the second circuit board comprises a recess or orifice below the magnetic field detector configured to allow one end of the magnetic circuit core to be positioned therein.

In an advantageous embodiment, the magnetic core support portion comprises a slot in which the magnetic circuit strip is positioned.

In an advantageous embodiment, the transducer comprises a magnetic shield having a U shape inserted over the magnetic circuit and supported on the main body portion of the inner support part.

In an embodiment, the magnetic circuit core has a thickness of less than 0.03 mm.

In an advantageous embodiment, the magnetic core support portion and main body portion comprise complementary latch portions to fix together the portions in the wrapped around position.

Further objects and advantageous aspects of the invention will be apparent from the claims, the following detailed description, and drawings in which:

FIG. 1d is an exploded perspective view of the current transducer of FIG. 1a;

FIGS. 2a to 2f are views in perspective showing assembly of components forming the current transducer of FIGS. 1a-1d;

FIGS. 3a and 3b are perspective views of a primary circuit unit of a current transducer according to an embodiment of the invention;

FIGS. 4a and 4b are perspective views of a secondary circuit unit of a current transducer according to an embodiment of the invention.

Figure 1B:
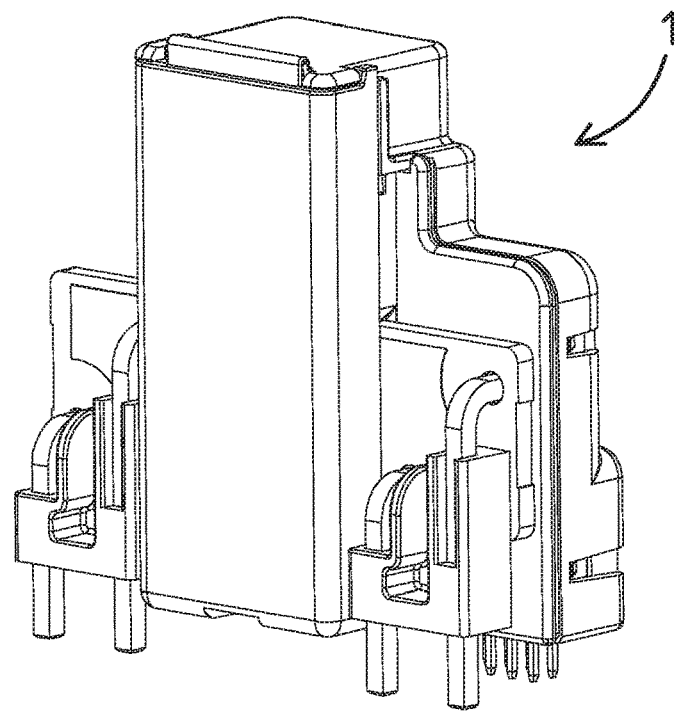
FIGS. 1a and 1b are views in perspective of an electrical current transducer according to an embodiment of the invention.

Referring to the Figures, an electrical current transducer 1 according to an embodiment of this invention comprises a primary circuit unit 2, a secondary circuit unit 4 and a housing 6. The primary circuit unit 2 comprises primary conductors 9a, 9b through which the current to be measured flows.

In the illustrated embodiment, the primary circuit unit comprises a first circuit board 22 and a connection portion 20 for connecting the primary conductors to external primary conductors. The connection portion 20 comprises first and second connectors 20a, 20b connected to first and second ends of the primary conductors.

The circuit board comprises conductive tracks that are electrically connected to electrical terminals of the first and second connectors 20a, 20b.

In the embodiment illustrated, there are at least first 9a and second 9b primary conductors. The first and second primary conductors may be configured to carry currents flowing in opposite directions such that the magnetic fields generated by the electrical currents flowing in the primary conductors tend to cancel each other out. The primary conductors may in particular carry a current of a same electrical circuit, for instance the positive and negative lines of an electrical circuit. In case of an imbalance in the electrical current in the positive and negative lines the magnetic field generated by the opposed primary conductors is not cancelled and may thus be detected. This may signal a leakage current or other anomaly.

The transducer may be used for detecting a non-zero total current, sometimes called differential current or residual current.

The transducer may also be employed on an earth connection forming a single primary conductor track to detect residual currents in a non-differential operating mode.

The transducer may also be employed for measuring currents in a primary conductor in a closed-loop configuration, whereby a compensation coil is driven by a compensation current to generate a magnetic field seeking to cancel the magnetic field generated by the primary current.

As the magnetic field generated by the electrical current transducer is close to zero in normal operating mode for the various embodiments described above, the magnetic circuit core does not require a large cross-section to avoid saturation.

In an embodiment, the primary conductors comprise circuit traces formed on the first circuit board. A first primary conductor portion 9a is formed by one or more circuit traces on one or more layers of the first circuit board 22, and a second primary conductor portion 9b is formed by one or more circuit traces on one or more other layers of the first circuit board 22. In the illustrated embodiment, the first primary conductor portion comprises two circuit traces, one on each outer side of the circuit board as best seen in FIGS. 1c, 3a and 3b. The second primary conductor portion comprises two circuit traces positioned on layers positioned within the circuit board between the outer sides, as best seen in FIG. 1c. Various other configurations may however be provided within the scope of the invention, for instance:

- each primary conductor portion may comprise only one circuit trace on one layer of the board, whereby for instance the first and second primary conductor portions are disposed on opposed outer sides of the board, or
- each primary conductor portion may comprise a plurality of layers greater than two; or
- each primary conductor portion may comprise a circuit trace on an outer side of the circuit board and one or more further circuit traces on a layer within the circuit board;
- the circuit traces of the first and second primary conductor portions on different layers may be on alternate layers (i.e. interleaved) such that at least one of the first primary conductor portions is positioned between two second primary conductor portions, and at least one of the second primary conductor portions is positioned between two first primary conductor portions.

The first and second primary conductor portions may thus be formed in any combination of arrangements on different layers of the circuit board.

In an embodiment, the primary conductor circuit traces comprise a width that extends a major part of the width of the first circuit board, in order to be able to carry a primary current with a relatively high amplitude.

In an embodiment, the primary conductor portions comprise wide end portions 30a and a narrower mid portion 30b extending between the end portions. This configuration helps to increase the magnetic flux density concentrated in the magnetic core that encircles the mid portion 30b. The first and second primary conductor circuit traces may advantageously comprise substantially identical or similar surface areas and similar shapes overlapping each other by more than 80%, seen in a direction orthogonal to the surfaces of the circuit board.

In the case of a differential current measurement, where the first and second primary conductor portions carry currents flowing in opposite directions, the substantially matching and closely positioned overlapping layers are effective in cancelling the magnetic field generated by currents on same amplitude but opposing direction.

In an embodiment, the secondary circuit unit 4 comprises a magnetic field detector 8 that may for instance be in the form of a Hall sensor mounted on a second circuit board 25 and interconnected via conductive circuit traces to a connector 28 comprising terminals connected to the circuit traces on the circuit board. The connector 28 presents terminals 29 for instance in the form of pin terminals at a same mounting side as the terminals of the first and second connectors of the primary circuit unit such that the electrical current transducer can either be mounted on an external circuit board or connected to an external connector, for instance a pluggable connector.

The second circuit board 25 may advantageously comprise a recess or an orifice 26 positioned below the magnetic field detector 8 in order to allow a first end 3a of the magnetic circuit 3 to be positioned adjacent an underside of the magnetic field detector 8, another end 3b of the magnetic circuit being positioned above the magnetic field detector on a upper side. A magnetic circuit gap 7 is formed between opposing ends 3a, 3b of the magnetic circuit 3, the magnetic field detector 8 being positioned in the magnetic circuit gap.

In an embodiment, the secondary circuit unit comprises a compensation coil 10 driven by a feedback loop circuit connected to the magnetic field sensor, configured to generate a magnetic field seeking to cancel the magnetic field generated by the primary current. In the illustrated embodiment, the compensation coil 10 advantageously comprises a winding of conductive circuit trace formed on the second circuit board 25, the circuit trace encircling the magnetic field sensor. The circuit trace may be provided on a single layer of the circuit board or on two or more stacked layers of the circuit board in order to increase the density and number of windings.

The housing 6 comprises an outer casing 12 and an inner support part 14. The inner support part 14 comprises a main body portion 16 and a magnetic core support portion 18 hingeably connected to the main body portion via hinge portions 42a, 42b. The inner support part is in a preferred embodiment formed as a single integral part, for instance a plastic injection molded part. The main body portion comprises a primary circuit unit lodging 31 in the form of a slot in which the first circuit board 22 of the primary circuit unit 2 may be inserted. The conductive traces carrying the primary current may therefore be accurately positioned within the inner support part 14. The lodging 31 and primary circuit unit are provided with complementary positioning and fixing elements to accurately position and secure the primary circuit unit to the inner support part 14 after assembly of the two components.

The magnetic circuit comprises a magnetic core 24 that in an advantageous embodiment is in the form of a thin strip or band of amorphous or nanocrystalline magnetic material. A strip of amorphous magnetic material may be cut from a reel of material and is particularly cost-effective to manufacture. Also, the thin strip of amorphous magnetic material is easily deformable and may be bent to form a generally oval shape as will be discussed hereinafter. The strip of band has a thickness that is preferably less than 0.1 mm, for instance a cobalt based amorphous alloy with a thickness of 0.02 mm. The reluctance of the magnetic core should be lower than the reluctance of the magnetic circuit gap (also called "airgap") preferably at least five times lower, more preferably at least 10 times lower.

The magnetic circuit may be formed by a single thin strip or band of amorphous or nanocrystalline magnetic material, or by two or more strips, stacked upon each other, if needed to avoid saturation of the core for the operating conditions and operating range of the current transducer.

An example of the estimation of the reluctance of the airgap and the magnetic core is shown below for illustrative purposes:

Airgap:

length $l=10^{-3}$ m, cross section $A=3\times3\times10^{-6}$ m$^2$, rel. permeability $\mu_r=1$ $$R_{M\,gap} = 1/(\mu_0\mu_r) \times l/A = 1/\mu_0 \times 111$$

Magnetic Circuit:

length $l=0.1$ m, cross section $A=3\times0.02\times10^{-6}$ m$^2$, rel. permeability $\mu_r=10^5$ $$R_{M\,core} = 1/(\mu_0\mu_r) \times l/A = 1/\mu_0 \times 16.7$$

The main body portion 16 of the inner support part 14 further comprises a secondary circuit unit lodging recess 32 within which the second circuit board 25 of the secondary circuit unit is inserted. Fixing posts or latching protrusions or other fixing elements may be provided to secure and position the secondary circuit unit 4 within the lodging recess 32. The fixing posts 36 ensure also an accurate positioning of the magnetic field detector 8 within the lodging recess and therefore with respect to the inner support part 14.

The inner support part 14 may advantageously comprise a positioning recess or slot that is formed within the magnetic core support portion 18 but also within the main body portion 16. The positioning recess or slot 18 is dimensioned so as to receive therein the longitudinal strip of magnetic core such that the side edges of the strip are within the recess and held by sidewalls of the recess. The positioning recess or slot 18 may be provided advantageously with a positioning portion 40 that positions one end of the magnetic core 24 below the magnetic field detector 8, and in particular within the orifice 26 of the circuit board positioned below the magnetic field detector 8. The magnetic core end positioning portion 40 has a raised surface such that the magnetic core is positioned within the orifice 26. The magnetic core 24 may be held within the recess 18 by latching protrusions, or by spot welding edges of the recess during the assembly process, such that they flow over edges of the magnetic core strip.

Figure 2C:
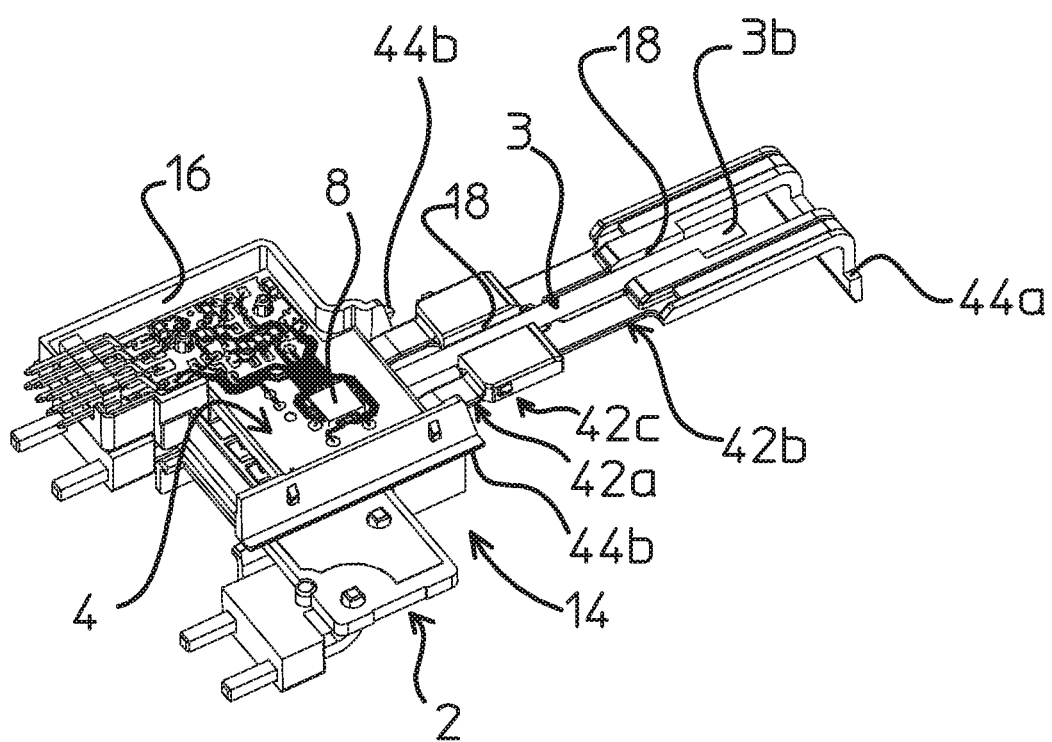

As best seen in the FIGS. 2a to 2f, assembly of the electrical current transducer is illustrated. Referring first to FIGS. 2a and 2b, the primary circuit unit 2 and in particular the first circuit board 22 may be inserted into the primary circuit unit lodging 31 of the inner support part 14. Before or after this operation, the magnetic core 24 may be inserted in the positioning recess of the magnetic core support portion 18 and securely fixed therein, for instance by ultrasonic welding of wall portions bounding the recess such that the material flows over edges of the magnetic core strip and secures it within the positioning recess.

The secondary circuit unit 4 is inserted in the secondary circuit unit lodging 32 of the main body portion 16 of the inner support part 14 as best seen in FIG. 2c.

The magnetic core support portion 18 of the inner support part may then be pivoted around the hinge portions 42a, 42b such that the second end 3b of the magnetic circuit strip bends around the main body portion 16, thus going through a 360° rotation, until the second end 3b is positioned over the magnetic field detector 8. The second end 3b of the magnetic core positions over and above the first end 3a of the magnetic core forming the magnetic circuit gap 7 therebetween. The magnetic core support portion 18 may comprise a latch 44a that engages a complementary locking shoulder 44b in the fully rotated position, as best seen in FIGS. 2d, 2e and 1c. In the illustrated embodiment, the magnetic core support portion 18 is provided with two hinge portions 42a, 42b that allow the end of the magnetic core support portion to swivel around 360° while an intermediate stiff portion 42c rests against a surface of the main body portion 16.

Once the magnetic core support portion 18 has been folded over by 360° and latched to the main body portion 16 as shown in FIGS. 2d, 2e and 2f, a magnetic shield 5 may optionally be inserted over and fixed to the inner support part 14 overlapping the magnetic circuit 3. This is best illustrated in FIGS. 2f and 1c. The magnetic shield may advantageously be made of a magnetic material and serves to absorb magnetic flux external to the transducer and shield the magnetic circuit from external magnetic fields. The magnetic shield 5 may advantageously be in the form of a generally U-shaped part made of soft magnetic material in a sheet form that is stamped and formed, which is particularly cost-effective to manufacture.

The inner support part 14 may advantageously be provided with sidewall portions 43 that engage with side edges 13 of the lateral branches 5a, 5b of the magnetic shield so as to position and secure the magnetic shield to the inner support part 14. The side edges may comprise barbs that dig into the sidewall portions 43, or other means to secure the shield to the inner housing 14.

In a subsequent step, the outer case 12 may be positioned over the inner support to cover the magnetic circuit and the magnetic shield therein.

Figure 1A:
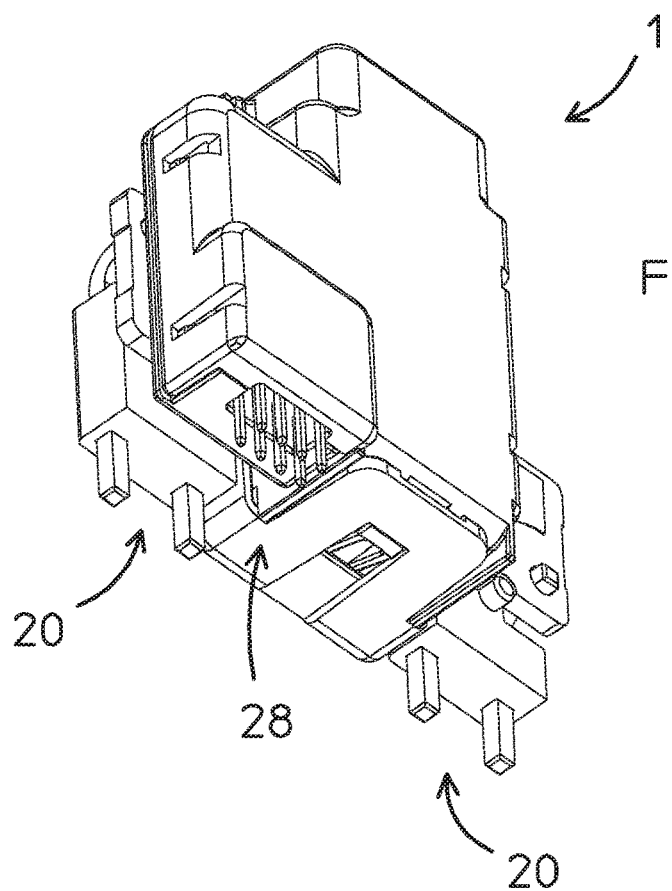
Figure 1C:
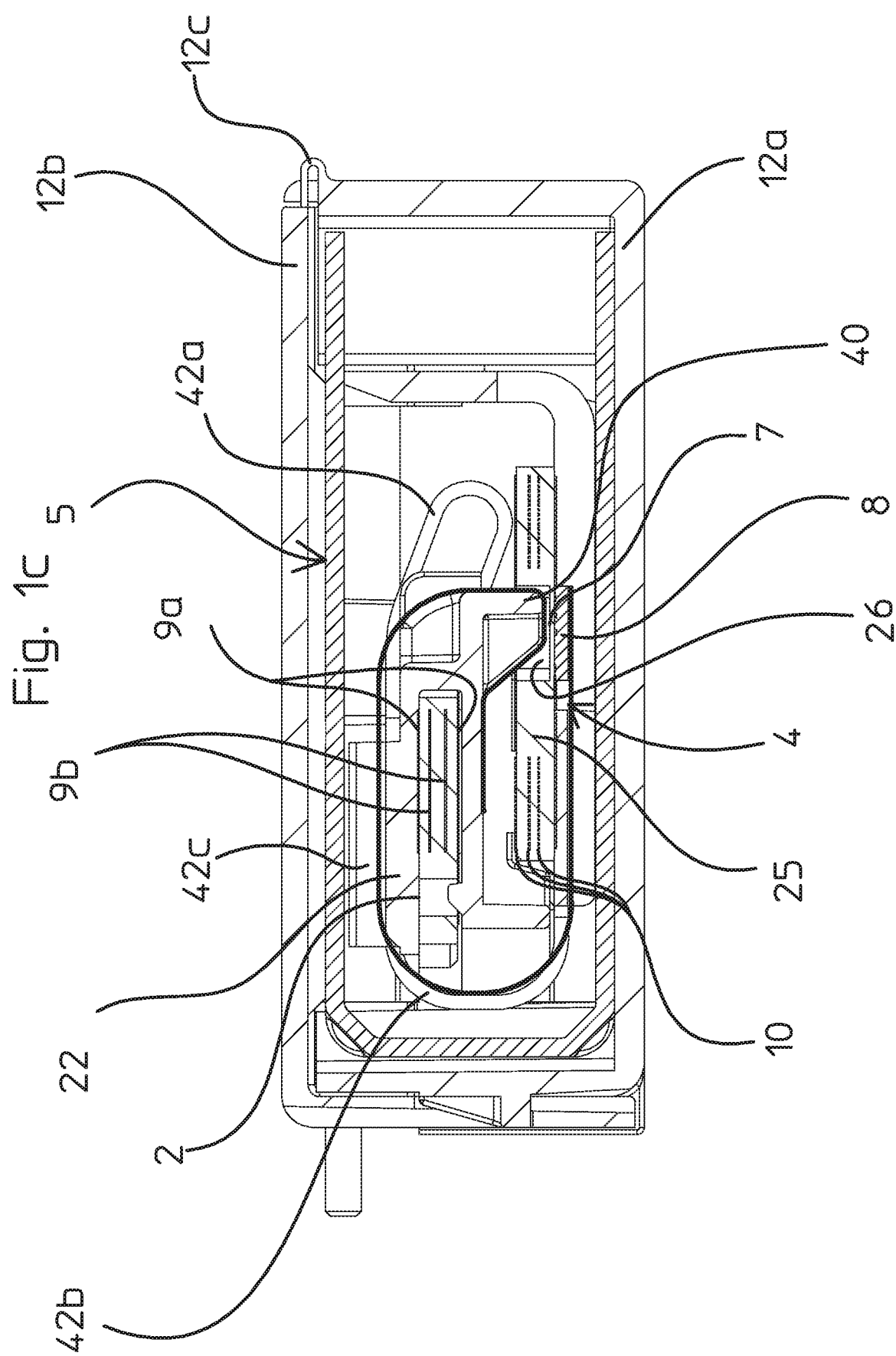
FIG. 1c is a cross-sectional view of the current transducer of FIGS. 1a, 1b.
Figure 1D:
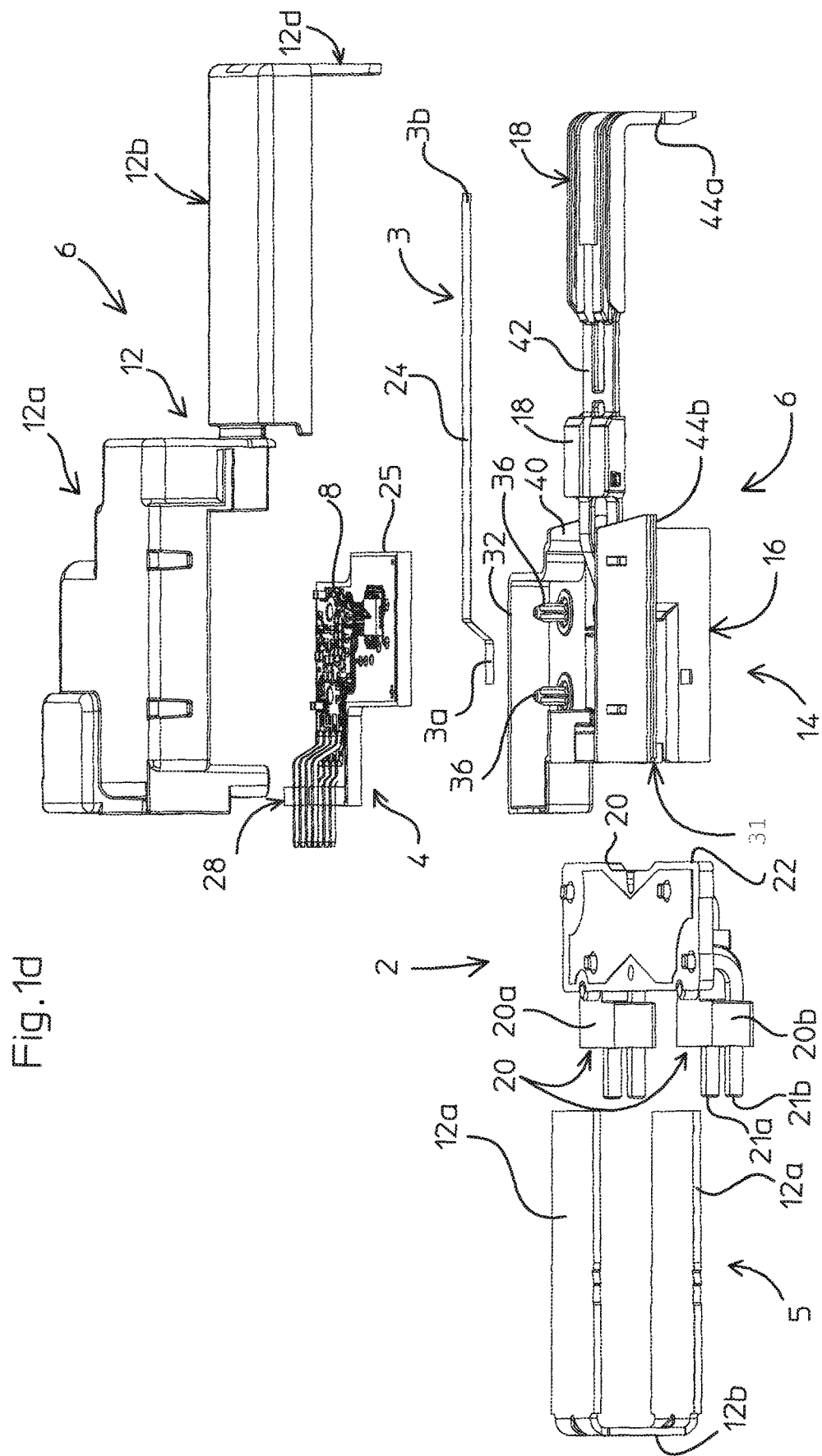
Figure 2E:
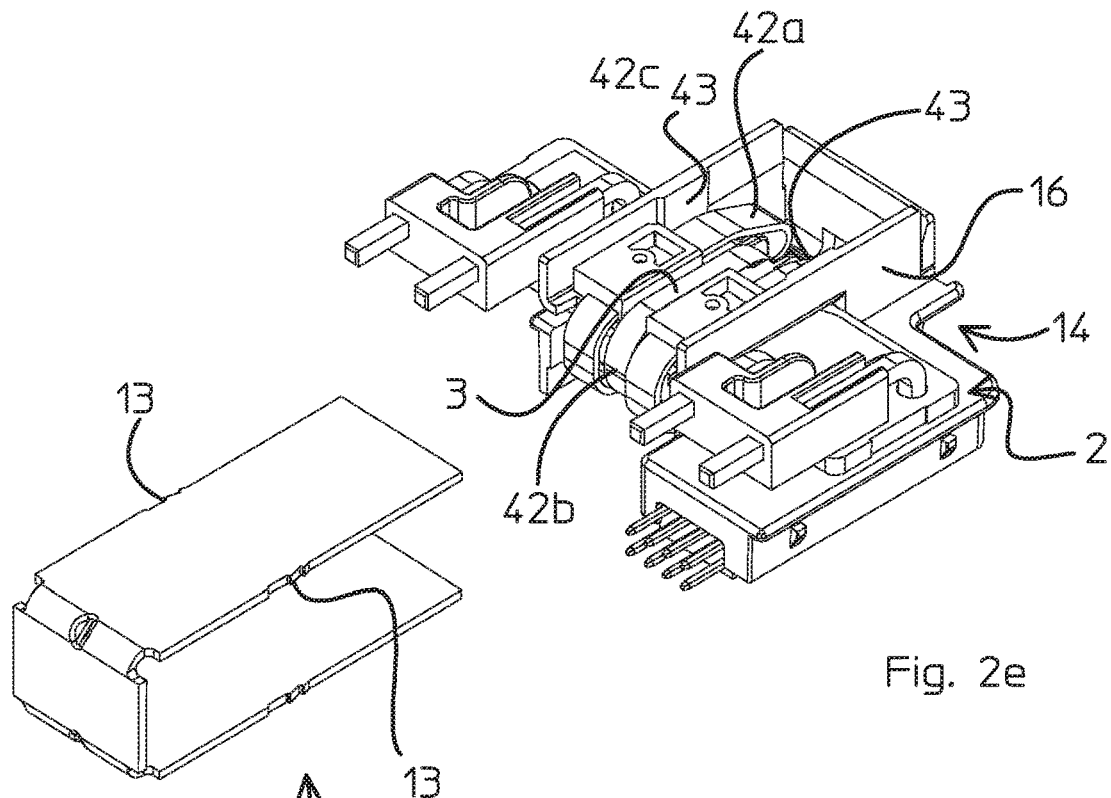
Figure 2D:
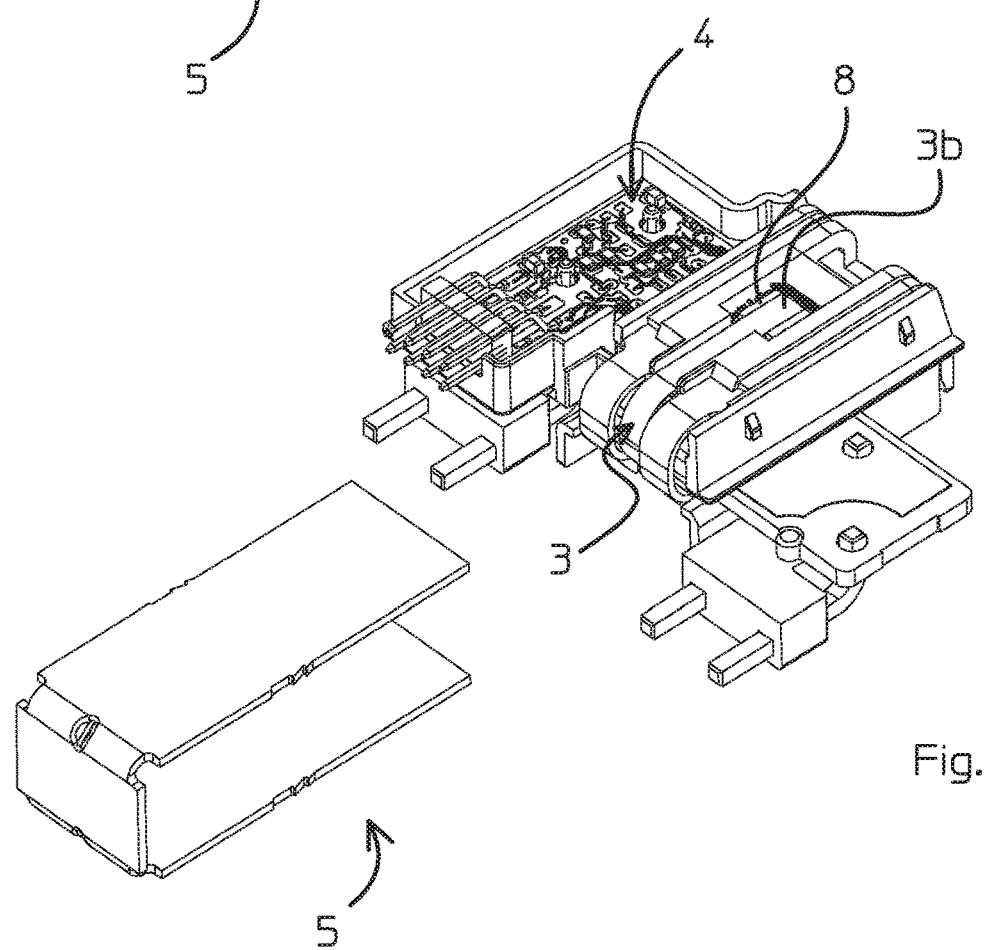

In an advantageous embodiment, the outer case may be provided with a base 12a and a cover 12b connected together by a hinge 12c, for instance an integrally formed hinge, allowing the cover to swivel 180° degrees around and latch onto the base 12a via latching elements 12d as illustrated in FIGS. 2f, 1c and 1a.

LIST OF REFERENCES IN THE FIGURES electrical current transducer 1
primary circuit unit 2 primary conductors 9a, 9b
circuit traces
narrow mid portion 30b
wide end portions 30a

```
connection portion 20
first and second connectors 20a, 20b
first and second terminals 21a, 21b
first circuit board 22
magnetic circuit 3 first end 3a
second end 3b
magnetic core 24
strip/band
of amorphous magnetic material
magnetic circuit gap 7 (air gap)
secondary circuit unit 4 magnetic field detector 8
hall sensor
compensation coil 10
second circuit board 25
orifice 26
connector 28
magnetic shield 5 lateral branches 5a
end branch5b
housing 6 outer casing 12
base 12a
cover 12b
integral hinge 12c
latch 12d
inner support part 14
main body portion 16
primary circuit unit lodging 31
slot
secondary circuit unit lodging 32
fixing posts 36
magnetic core support portion 18
positioning recess/slot
magnetic core end positioning portion 40
hinge portions 42a, 42b
latching portions 44a, 44b
```

The invention claimed is:

1. A current transducer including a housing comprising an outer casing, a magnetic circuit core configured to encircle at least one primary conductor, and a magnetic field detector positioned in a magnetic circuit gap of the magnetic circuit core, wherein the housing further includes an inner support part comprising a main body portion and a magnetic core support portion and the magnetic circuit core is in the form of at least one strip of amorphous material with a magnetic reluctance smaller than the reluctance of the magnetic circuit gap and having a thickness less than 0.1 mm supported on the main body portion and magnetic core support portion, the magnetic circuit gap being formed between overlapping ends of the strip.

2. The transducer according to claim 1, wherein the main body portion and the magnetic core support portion are connected via hinge portions configured to allow the magnetic core support portion to wrap around the main body portion.

3. The transducer according to claim 2, wherein the hinge portions are flexible webs integrally formed with the main body portion and magnetic core support portion.

4. The transducer according to claim 1, including a primary circuit unit comprising a first circuit board lodged in the main body portion of the inner support part and at least one conductive trace on the first circuit board constituting a portion of the at least one primary conductor.

5. The transducer according to claim 4, wherein the first circuit board comprises a plurality of circuit traces on different layers of the first circuit board, forming said at least one primary conductor.

6. The transducer according to claim 5, comprising two primary conductors configured to carry currents flowing in opposing directions, wherein the transducer is configured for a differential current measurement.

7. The transducer according to claim 6, wherein the circuit traces on different layers overlap each other by at least 80%, seen in a direction orthogonal to the first circuit board.

8. The transducer according to claim 4, wherein said one or more conductive traces of the one or more primary conductor portions comprise a mid-portion of narrower width than end portions.

9. The transducer according to claim 8, comprising a secondary circuit unit comprising a second circuit board lodged in the main body portion of the inner support part, the magnetic field detector being mounted on the second circuit board.

10. The transducer according to claim 9, wherein the secondary circuit unit comprises a compensation coil in the form of windings of a circuit trace on one or more layers of the second circuit board around the magnetic field detector.

11. The transducer according to claim 10, wherein the second circuit board comprises a recess or orifice below the magnetic field detector configured to allow one end of the magnetic circuit core to be positioned therein.

12. The transducer according to claim 1, wherein the magnetic core support portion comprises a slot in which the magnetic circuit core is positioned.

13. The transducer according to claim 1, comprising a magnetic shield having a U shape inserted over the magnetic circuit core and supported on the main body portion of the inner support part.

14. The transducer according to claim 1, wherein the magnetic circuit core has a thickness of less than 0.03 mm.

15. The transducer according to claim 1, wherein the magnetic core support portion and main body portion comprise complementary latch portions to fix together the magnetic core support portion and main body portion in a wrapped around position.

* * * * *